(12) United States Patent
Dosunmu et al.

(10) Patent No.: US 12,298,560 B2
(45) Date of Patent: May 13, 2025

(54) GERMANIUM WAVEGUIDE PHOTODETECTOR WITH INTEGRATED HEATER

(71) Applicant: Intel Corporation, Santa Clara, CA (US)

(72) Inventors: Olufemi I. Dosunmu, San Jose, CA (US); Zhi Li, San Jose, CA (US); Mengyuan Huang, Cupertino, CA (US); Aliasghar Eftekhar, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 654 days.

(21) Appl. No.: 17/523,668

(22) Filed: Nov. 10, 2021

(65) Prior Publication Data

US 2022/0107461 A1    Apr. 7, 2022

(51) Int. Cl.
| | |
|---|---|
| *G02B 6/136* | (2006.01) |
| *G02B 6/12* | (2006.01) |
| *H01L 31/0232* | (2014.01) |
| *H01L 31/024* | (2014.01) |
| *H01L 31/028* | (2006.01) |
| *H01L 31/18* | (2006.01) |

(52) U.S. Cl.
CPC ......... *G02B 6/136* (2013.01); *G02B 6/12004* (2013.01); *H01L 31/02327* (2013.01); *H01L 31/024* (2013.01); *H01L 31/028* (2013.01); *H01L 31/1804* (2013.01); *G02B 2006/12061* (2013.01)

(58) Field of Classification Search
CPC .... G02B 6/136; G02B 6/12004; G02B 6/122; G02B 6/132; G02B 2006/12061; G02B 2006/12035; G02B 2006/12138; H01L 31/02327; H01L 31/024; H01L 31/028; H01L 31/1804; H01L 31/09; G01J 1/42; H01B 3/06
See application file for complete search history.

(56) References Cited

U.S. PATENT DOCUMENTS

| | | | |
|---|---|---|---|
| 7,262,117 B1* | 8/2007 | Gunn, III | H01L 21/26506 257/E21.103 |
| 9,213,137 B2* | 12/2015 | Verma | H01L 31/105 |
| 11,536,897 B1* | 12/2022 | Thompson | G02B 6/4243 |
| 11,703,643 B2* | 7/2023 | Coolbaugh | H01L 21/02381 438/69 |
| 11,769,849 B2* | 9/2023 | Takeda | H01L 31/022408 257/443 |
| 12,046,689 B2* | 7/2024 | Chern | H01L 31/035254 |
| 2008/0193076 A1* | 8/2008 | Witzens | G02B 6/12007 385/14 |
| 2009/0324164 A1* | 12/2009 | Reshotko | G02B 6/1228 257/432 |

(Continued)

*Primary Examiner* — Andrew Jordan
(74) *Attorney, Agent, or Firm* — Alliance IP, LLC (57) ABSTRACT

In one embodiment, an apparatus includes a substrate, an oxide layer on the substrate, a silicon layer on the oxide layer, which includes a waveguide region and etched regions adjacent to the waveguide region, a germanium layer on the silicon layer and adjacent the waveguide region of the silicon layer, and a resistive element adjacent to the germanium layer to provide heat to the germanium layer in response to a current applied to the resistive element.

20 Claims, 8 Drawing Sheets

(56) References Cited

U.S. PATENT DOCUMENTS

| | | | | |
|---|---|---|---|---|
| 2012/0129302 A1* | 5/2012 | Assefa | ............... | H01L 21/8238 |
| | | | | 257/E21.546 |
| 2012/0288971 A1* | 11/2012 | Bogaerts | ............... | H01L 31/105 |
| | | | | 438/57 |
| 2013/0328145 A1* | 12/2013 | Liu | ...................... | G02B 6/4215 |
| | | | | 257/432 |
| 2015/0016769 A1* | 1/2015 | Verma | ................ | G02B 6/12004 |
| | | | | 438/69 |
| 2019/0035948 A1* | 1/2019 | Bayn | ................ | H01L 31/02325 |
| 2020/0119205 A1* | 4/2020 | Gosciniak | ........... | H01L 31/1085 |
| 2020/0168750 A1* | 5/2020 | Baehr-Jones | ..... | H01L 27/14698 |
| 2021/0234058 A1* | 7/2021 | Zhang | ................ | H01L 31/1013 |
| 2021/0389521 A1* | 12/2021 | Holt | ...................... | H01L 31/028 |
| 2022/0102574 A1* | 3/2022 | Takeda | .................. | H01L 31/105 |
| 2022/0107461 A1* | 4/2022 | Dosunmu | .............. | G02B 6/132 |
| 2022/0130875 A1* | 4/2022 | Takeda | .............. | H01L 31/02327 |
| 2022/0229228 A1* | 7/2022 | Coolbaugh | ....... | H01L 31/02161 |
| 2022/0390280 A1* | 12/2022 | Pavanello | ............. | G01J 3/0259 |

* cited by examiner

GERMANIUM WAVEGUIDE PHOTODETECTOR WITH INTEGRATED HEATER

FIELD

This disclosure pertains to photodetectors, and in particular (but not exclusively) to germanium-based waveguide photodetector with an integrated heater.

BACKGROUND

Germanium waveguide photodetectors optimized for C-band operation (approximately 1520-1570 nm) are a key optoelectronic component for long-haul (e.g., >10 km) coherent inter-datacenter optical links. As such, this component must operate with high efficiency across the full C-band range, as well as across a wide temperature range (−5° C. to 80° C.). However, the responsivity of these devices, which refers to a measure of how efficiently the photodetector converts input optical signals into electrical signals, typically degrades beyond 1550 nm, and this effect becomes more severe at lower temperatures (e.g., below 25° C.).

DETAILED DESCRIPTION

In the following description, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present disclosure. It will be apparent, however, to one skilled in the art that these specific details need not be employed to practice the present disclosure. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system haven't been described in detail in order to avoid unnecessarily obscuring the present disclosure.

Germanium (Ge) waveguide photodetectors optimized for C-band operation (approximately 1520-1570 nm) are a key optoelectronic component for long-haul (e.g., >10 km) coherent inter-datacenter optical links. As such, this component must operate with high efficiency across the full C-band range, as well as across a wide temperature range (−5° C. to 80° C.). However, the responsivity of these devices, which refers to a measure of how efficiently the photodetector converts input optical signals into electrical signals, typically degrades beyond 1550 nm, and this effect becomes more severe at lower temperatures (e.g., below 25° C.).

Previous solutions to this issue have included strain engineering through deposition of strained dielectric layers atop the germanium waveguide mesa structure, use of a germanium-tin (GeSn) alloy material in place of pure germanium as the waveguide photodetector material system, and DBR (Distributed Bragg Reflector) grating patterning on the silicon (Si) waveguide at the germanium waveguide photodetector output port as a means of reflecting back any unabsorbed and guided optical signal. However, these solutions have at least certain problems associated therewith. For example, strain engineering may be prone to greater variability in performance due to process variability, greater sensitivity to process variability, less control, and performance tuning ability. Further, the use of GeSn alloy in place of pure Ge requires a greater degree of process development.

Accordingly, embodiments of the present disclosure include an integrated germanium waveguide photodetector heater solution that allows for the development of photodetectors that meet the stringent requirements of high bandwidth, e.g., >400 G, coherent receivers and/or coherent long distance, e.g., >10 km, inter-datacenter optical communications systems. The integrated heater solution may include a resistive element that surrounds or is otherwise adjacent to/near the germanium waveguide mesa structure. The resistive element may heat the germanium waveguide mesa structure to avoid the inherent blue shift in the germanium's absorption as its temperature decreases. As a result of this blue shift, the magnitude of the germanium waveguide photodetector's responsivity degradation is also strongly temperature dependent. While one potential method for increasing the Germanium waveguide photodetector's responsivity may be to increase the interaction length between optical signal and the germanium film by increasing the germanium waveguide photodetector length itself, this would be at the expense of bandwidth due to increased junction capacitance, which is an equally important performance metric for high bandwidth (e.g., >400 G) coherent applications.

The integrated heater designs described herein may mitigate the expected germanium waveguide photodetector response degradation at the low temperature range, while maintaining high bandwidth (>40 GHz) performance. Further, the integrated heater designs would provide a means of direct, localized temperature control of the germanium waveguide photodetector active region, and by extension control over the waveguide photodetector response, particularly beyond the 1550 nm optical wavelength range.

Figure 1A:
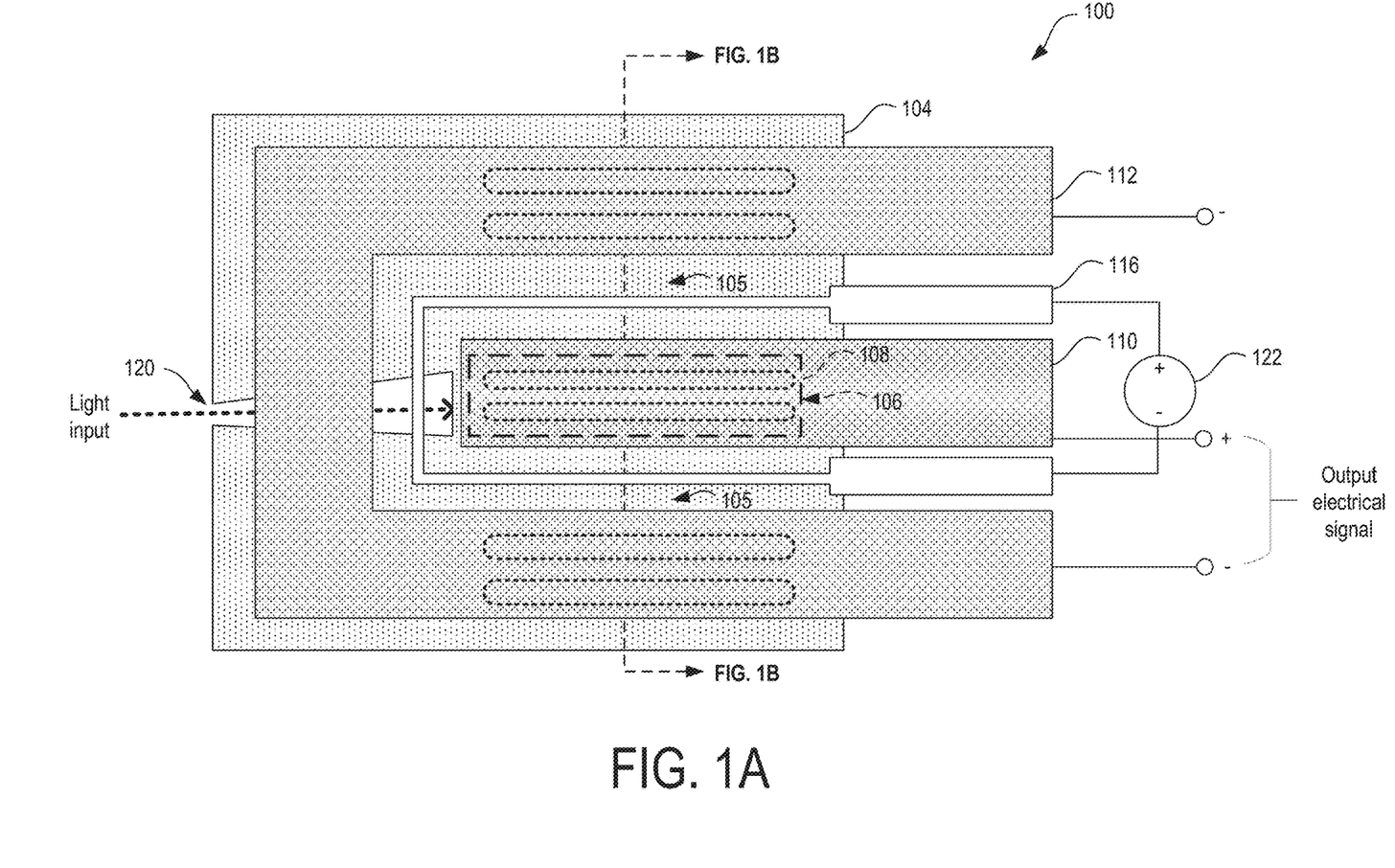
FIGS. 1A-1B illustrate an example germanium waveguide photodetector apparatus 100 in accordance with embodiments of the present disclosure.
Figure 1B:
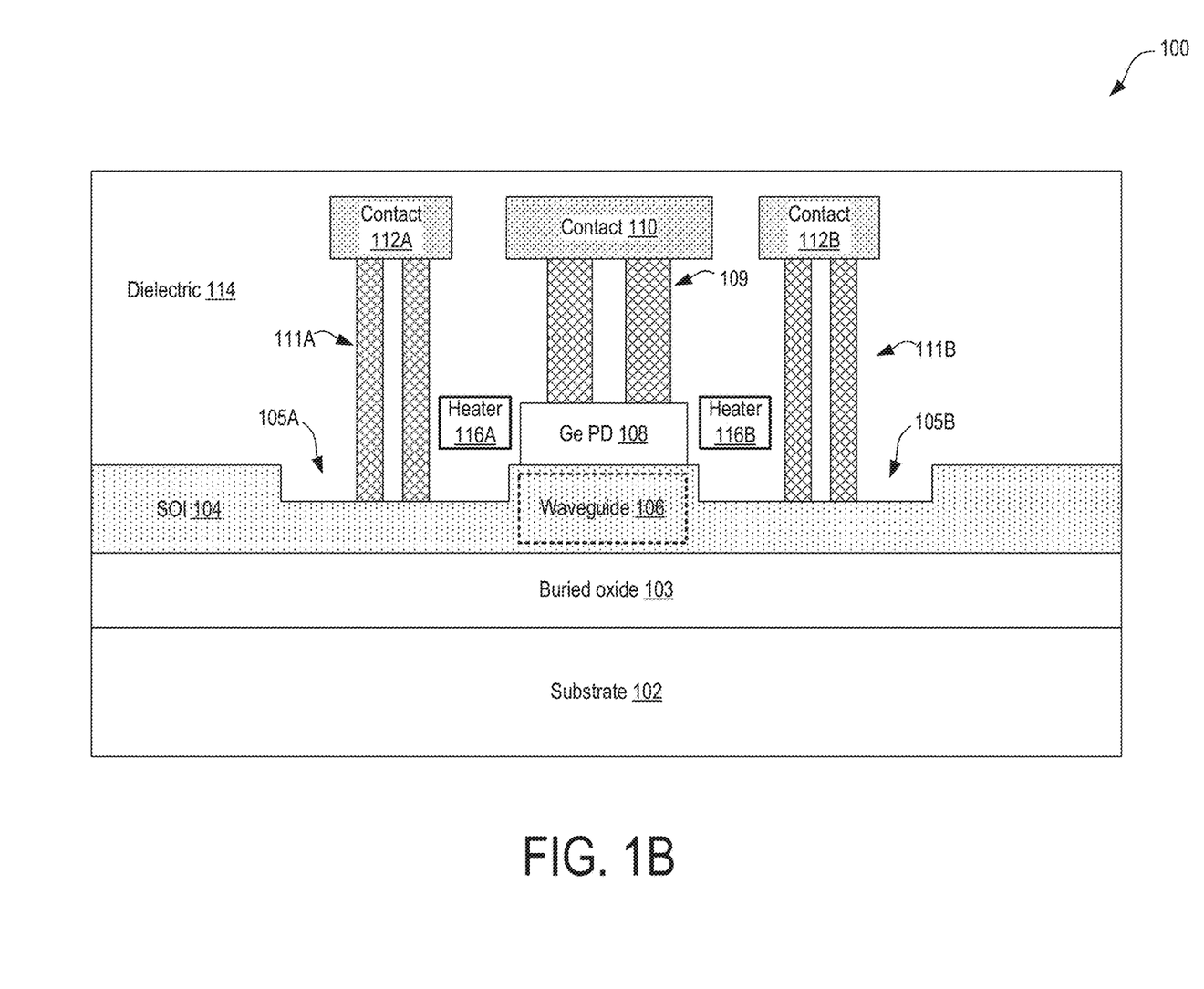

FIGS. 1A-1B illustrate an example germanium waveguide photodetector apparatus 100 in accordance with embodiments of the present disclosure. In particular, FIG. 1A illustrates a top view of the apparatus 100, while FIG. 1B illustrates a cross-sectional view of the apparatus 100 (from the dotted line shown in FIG. 1A). The example apparatus 100 includes a substrate 102 (e.g., silicon), a buried oxide layer 103 on the substrate (e.g., silicon oxide), and a silicon-on-insulator (SOI) layer 104 on the oxide layer 103. The SOI layer 104 includes a center waveguide region 106 and etched regions 105 on either side of the waveguide region 106. The etched regions 105 may allow for the waveguide region 106 to direct and guide light and prevent the light from leaking into the etched regions 105 or other areas of the SOI 104. In some embodiments, the SOI 104, including the etched regions 105 and waveguide region 106, may include dopants (e.g., Phosphorus, Arsenic, Boron) that reduce the resistivity of the regions to form a good ohmic contacts. The etched regions 105 are coupled to the contact 112 via pillars 111. In certain embodiments, the contact 112 and/or pillars 111 may include a metal. For example, in some embodiments, the contact 112 may be aluminum and the pillars may be tungsten.

The apparatus 100 also includes a germanium photodetector layer 108 on the SOI 104 and immediately above and adjacent to the waveguide region 106 of the SOI 104. In some embodiments, the germanium photodetector layer 108 may be composed of pure germanium, while in other embodiments the germanium photodetector layer 108 may include a compound that includes germanium, e.g., germanium-tin (GeSn). In certain embodiments, the germanium photodetector layer 108 may be generally rectangular in shape and may be approximately 20 um long (the left-to-right direction with respect to FIG. 1A), approximately 0.2-0.7 um thick (the up-down direction with respect to FIG. 1B), and approximately 2-5 um wide (the left-to-right direction with respect to FIG. 1B). During operation, incident light from an optical waveguide 120 is guided into and down the waveguide region 106 of the SOI 104 and the light is absorbed by the germanium photodetector layer 108 and converted to an electrical signal (through photocurrents within the germanium photodetector layer 108), which can be detected via the contacts 110, 112.

In addition, the apparatus 100 includes a resistive element 116 near the germanium photodetector layer 108 that serves to heat the germanium photodetector layer 108 via heat dissipation when a current is applied to the resistive element 116 (e.g., by a direct current (DC) voltage or current source such as DC source 122). In some embodiments, the DC source 122 may provide between 1-50 mW of power to the resistive element. In the example shown, the resistive element 116 is located inside the dielectric layer 114 (which may be an oxide, e.g., silicon oxide, or silicon nitride) between the pillars 111 and the germanium photodetector layer 108. However, the resistive element 116 may be located in any suitable location within the apparatus 100 that allows the resistive element 116 to heat the germanium photodetector layer 108. For instance, the resistive element 116 may be co-planar or at least partially co-planar with the germanium photodetector layer 108 in certain embodiments. In some embodiments, the resistive element 116 may be approximately 2 um wide and approximately 2 um away from the germanium photodetector layer 108. The resistive element 116 may have a length that is approximately the same as the germanium photodetector layer 108, which may be approximately 20 um in some embodiments. In certain embodiments, the resistive layer 116 may be formed in such a way that it surrounds at least a majority of the germanium photodetector layer 108, e.g., as shown in FIG. 1A, where the resistive element 116 is positioned on three sides of the generally rectangular germanium photodetector layer 108. The resistive element 116 may include any suitable resistive material that generates heat based on the flow of electrical current through the material. In some embodiments, for instances, the resistive element may include a polysilicon (poly-Si) material (e.g., doped polysilicon) or a suitable metal (e.g., titanium nitride (TiN) or tungsten).

The resistive element may be formed lithographically along with the other features of the apparatus 100, e.g., through material deposition techniques (e.g., chemical vapor deposition (CVD), etching, and/or photolithography. In some embodiments, the resistive element 116 may be formed after the formation of the germanium photodetector layer 108 and the dielectric layer 114. For instance, the resistive element 116 may be formed through dielectric trench patterning of poly-Si or by metal deposition, followed by chemical mechanical polishing (CMP) for metal line formation and isolation. Further, additional passivation (e.g., with silicon oxide ($SiO_2$) or silicon nitride ($Si_3N_4$)) may be performed to enable the formation of the contacts 110, 112.

Figure 2:
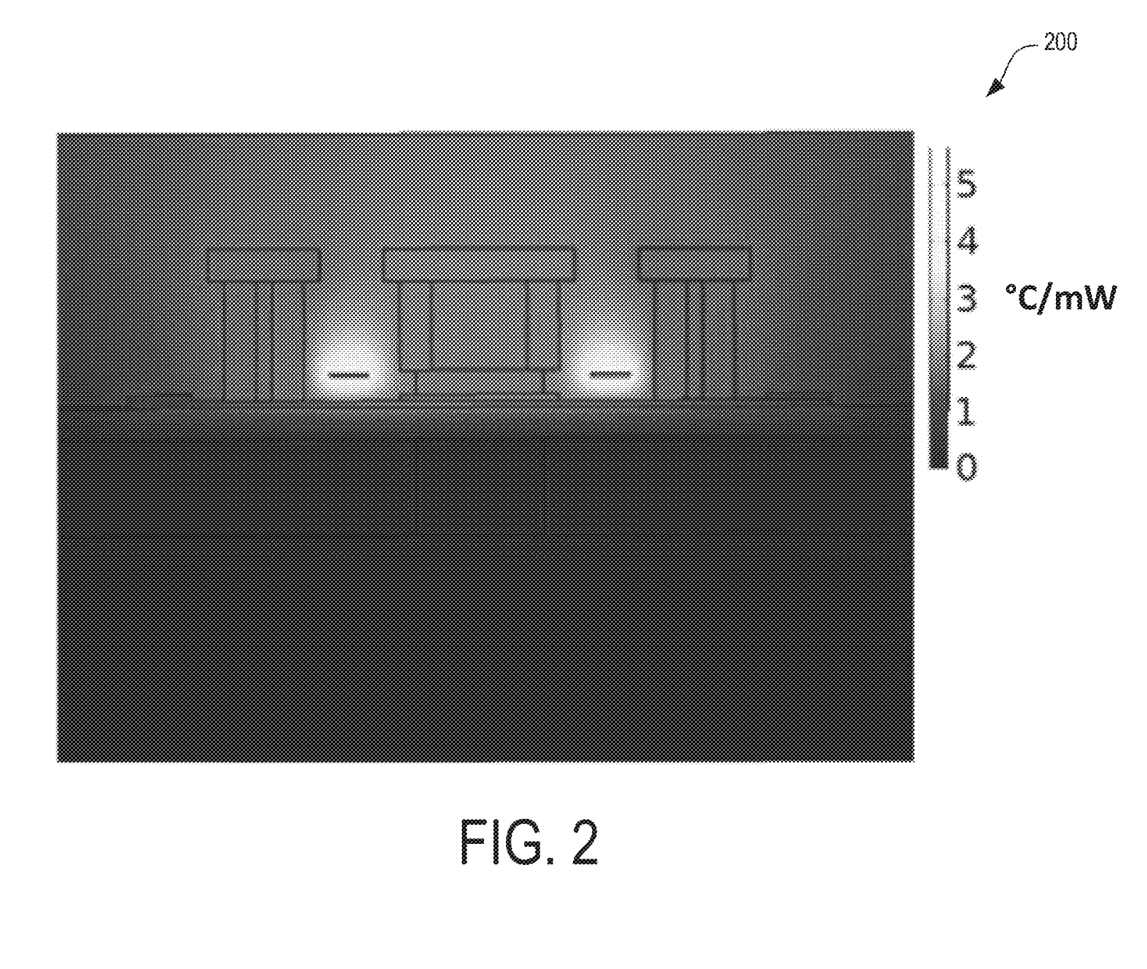
FIG. 2 illustrates example thermal simulation results for a germanium waveguide photodetector apparatus in accordance with embodiments of the present disclosure.
Figure 3:
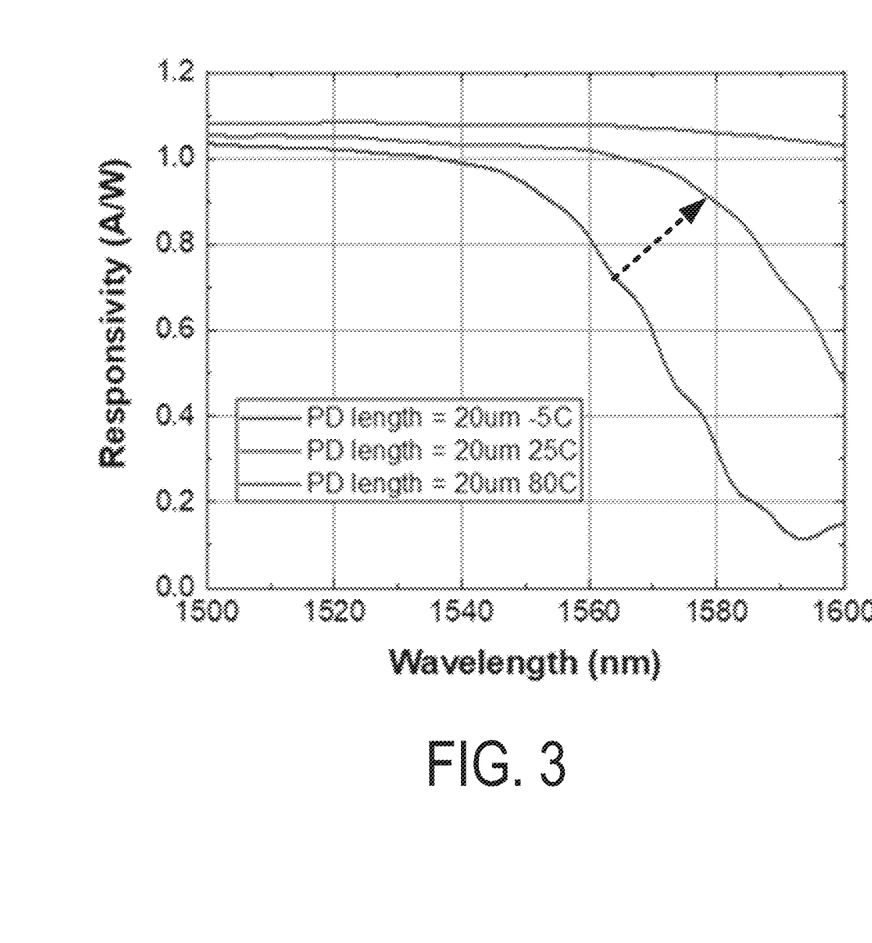
FIG. 3 illustrates an example responsivity of a germanium waveguide photodetector relative to wavelength.

FIG. 2 illustrates example thermal simulation results 200 for a germanium waveguide photodetector apparatus (e.g., 100) in accordance with embodiments of the present disclosure. The example results 200 show a temperature gradient in ° C./mW for a TiN resistive element incorporated into a photodetector apparatus similar to that shown in FIGS. 1A-1B with a 20 um-long germanium photodetector layer 108. A shown, when the resistive element 116 is driven at 1 mW power, there is a ~1.2° C. temperature increase around the germanium photodetector layer 108. This would indicate that driving the resistive element at 25 mW total power would increase the local temperature around the germanium photodetector layer 108 active region potentially from −5 C to 25 C, which is expected to effectively increase the photodetector response by nearly 70% at 1570 nm, as shown in FIG. 3, which illustrates responsivity of a germanium waveguide photodetector relative to wavelength.

Figure 4:
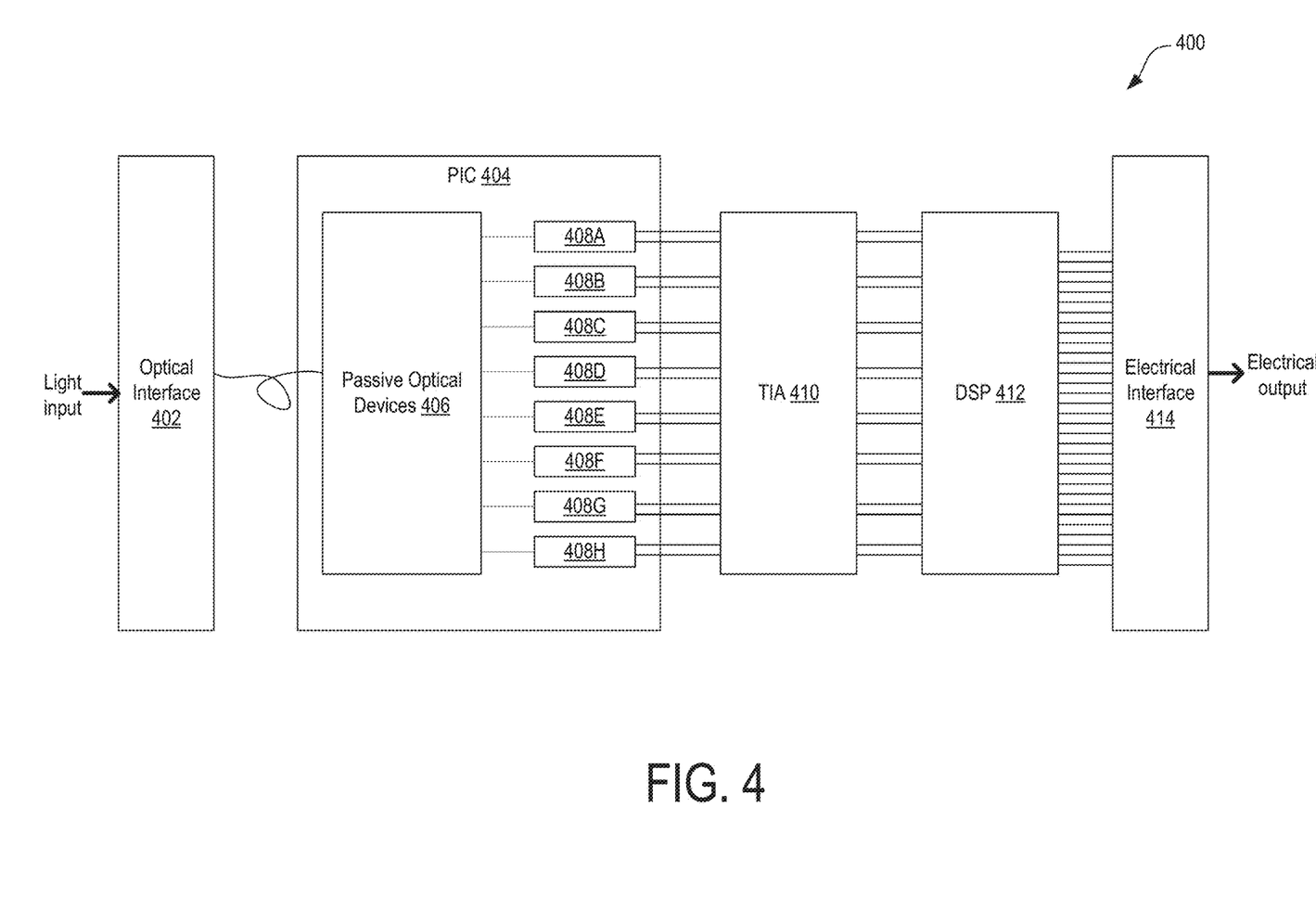
FIG. 4 illustrates an example optical receiver that includes a germanium waveguide photodetector apparatus in accordance with embodiments of the present disclosure

FIG. 4 illustrates an example optical receiver 400 that includes a germanium waveguide photodetector apparatus in accordance with embodiments of the present disclosure. The example optical receiver 400 includes an optical interface 402 that receives optical signals, e.g., from a fiber optic cable. The optical signals are provided to a photonic integrated circuit (PIC) 404, which includes a set of passive optical devices 406 that receive the optical signals from the optical interface 402 and a number of germanium waveguide photodetectors 408. The passive optical devices 406 may include any suitable passive optical devices, e.g., demultiplexers, polarization splitters, etc., which may be based on the implementation of the receiver 400. The photodetectors 408 receive optical signals (which may be modified from the optical signals received at the optical interface) from the passive optical devices 406 and generate electrical signals based on the optical signals from the passive optical devices 406. The photodetectors 408 may include a resistive element that heats the germanium photodetector element therein. For example, the photodetectors 408 may be implemented similar to the apparatus 100 of FIGS. 1A-1B.

The electrical signals generated by the photodetectors 408 are then provided to a transimpedance amplifier (TIA) 410, which may convert a current signal received from the photodetectors 408 into a voltage signal. The output signal from the TIA 410 is then provided to a digital signal processor (DSP) 412, may perform an analog to digital conversion in some embodiments. The DSP 412 then provides its output to an electrical interface 414, which provides an output electrical signal to one or more other devices within a system (e.g., a system similar to those described below).

Figure 5:
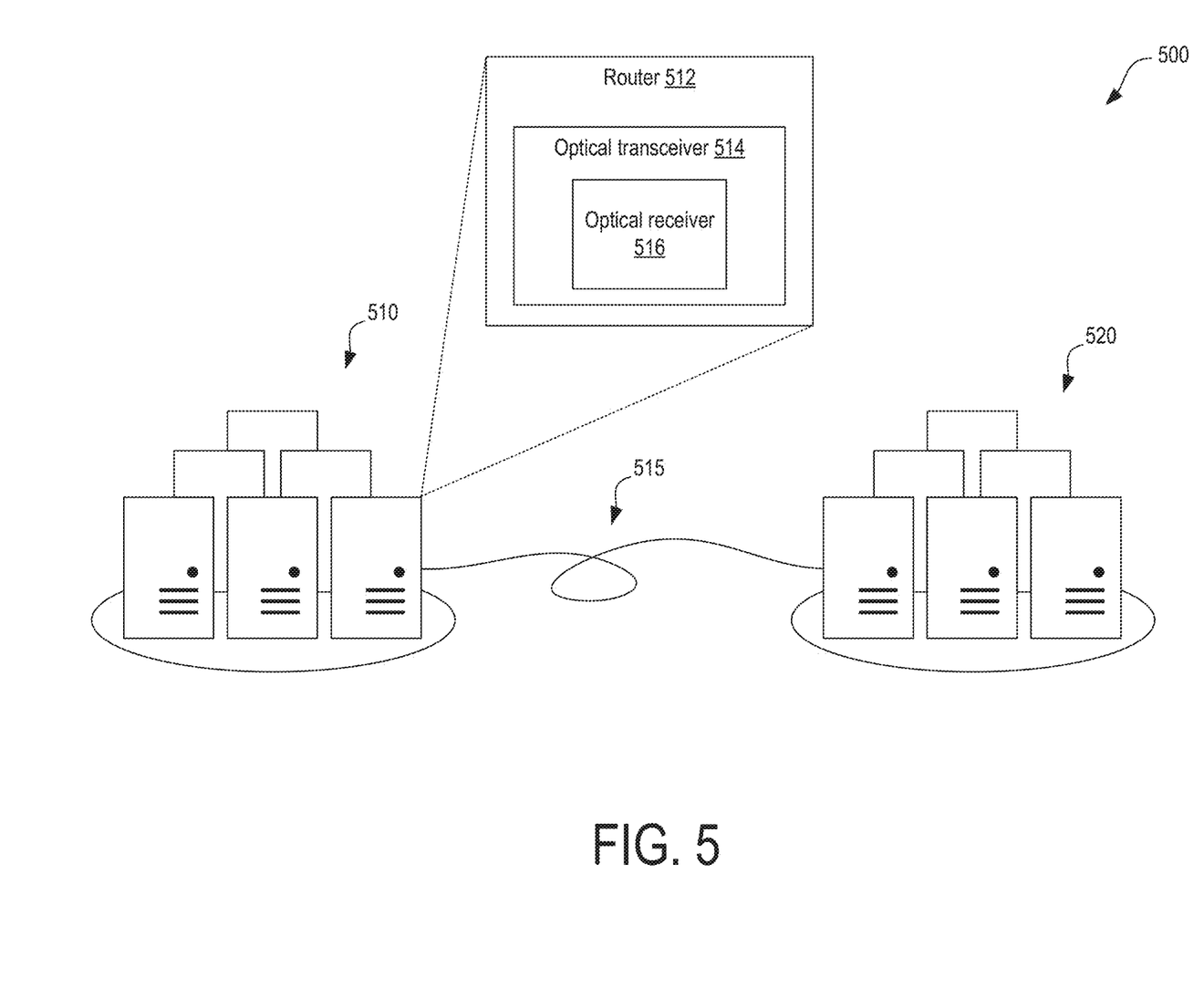
FIG. 5 illustrates an example system that includes an inter-datacenter optical link in accordance with embodiments of the present disclosure.

FIG. 5 illustrates an example system 500 that includes an inter-datacenter optical link 515 in accordance with embodiments of the present disclosure. In particular, the example system 500 includes a first datacenter 510 and a second datacenter 520 connected via an optical link 515. The optical link 515 may include one or more fiber optic cables that carry optical signals between the datacenters 510, 520. Each datacenter may include a number of computer systems that perform various functions, with at least certain of the computer systems being implemented as described below with respect to FIGS. 6-7. In addition, each datacenter may include a router (e.g., 512) that allows the computer systems of the datacenter to communicate with computer systems of another datacenter. The routers may, among other functions, receive electrical signals from the computer systems and convert the electrical signals to optical signals using an optical transmitter of an optical transceiver device (e.g., 514). The optical signals are then transmitted by the router over the optical link 515. In addition, the routers may receive optical signals at an optical receiver (e.g., 516) from the link 515 and convert the optical signals to electrical signals using one or more photodetectors, e.g., those described herein.

Figure 6:
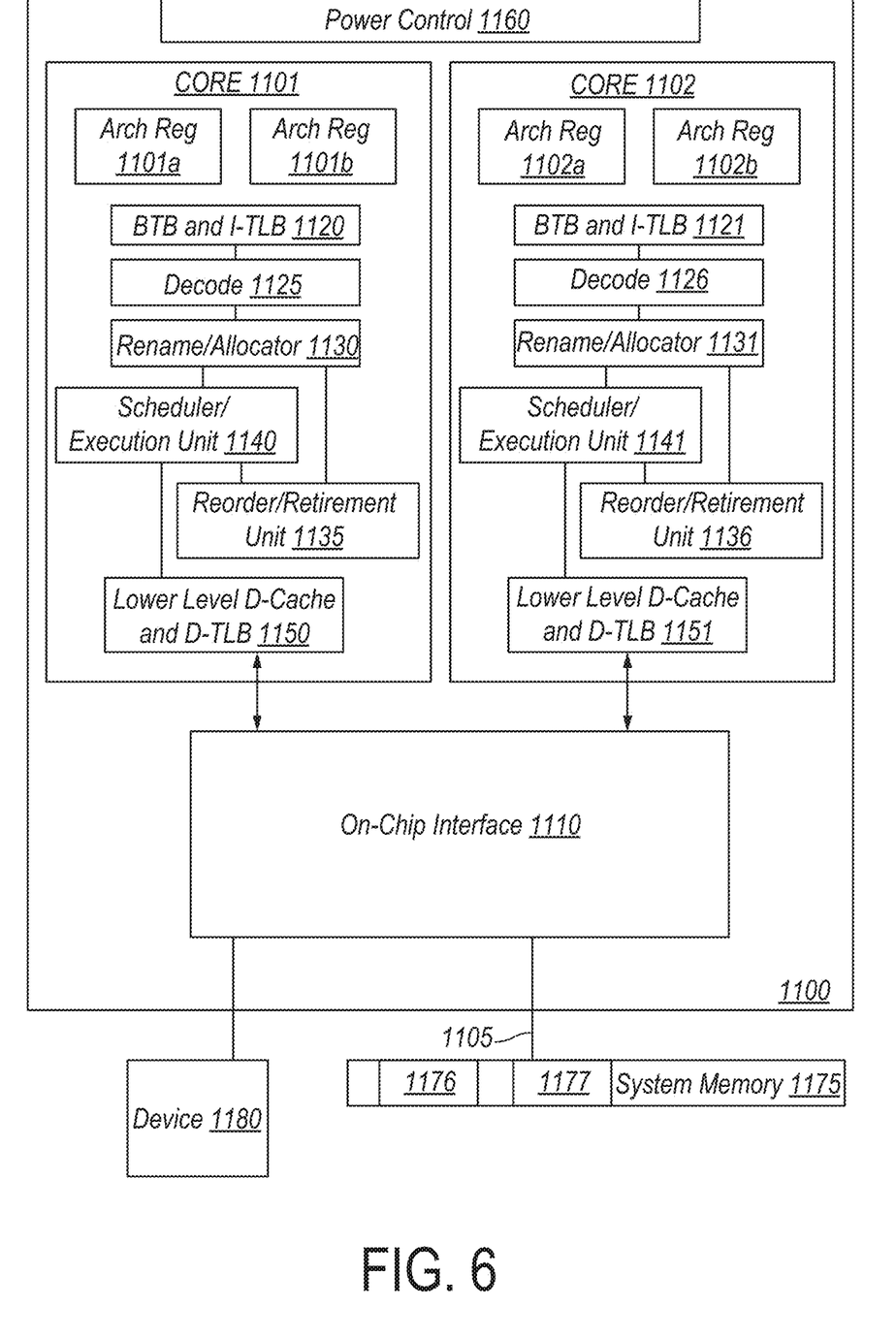
FIG. 6 illustrates an embodiment of a block diagram for a computing system including a multicore processor.
Figure 7:
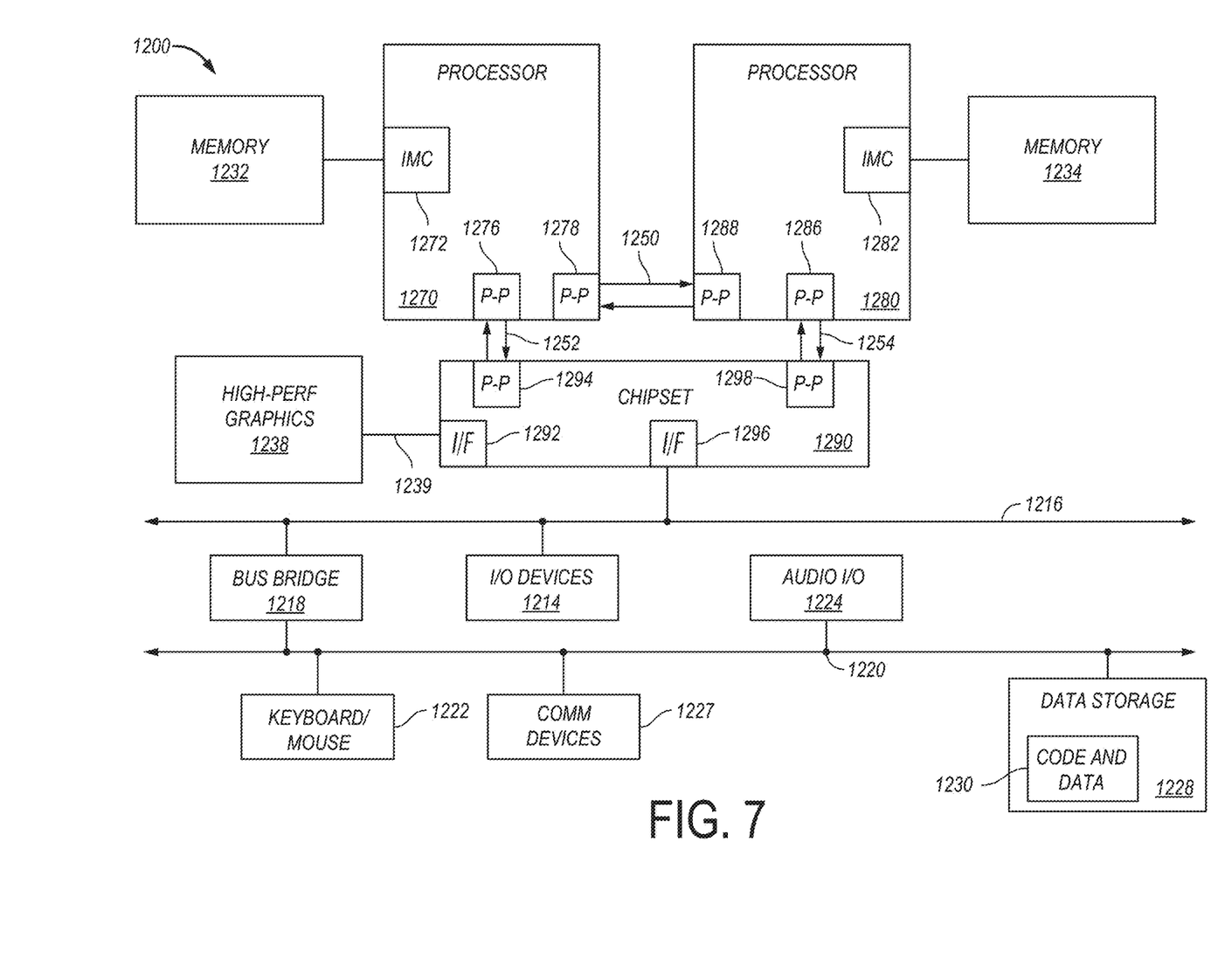
FIG. 7 illustrates an embodiment of a block for a computing system including multiple processors.

FIGS. 6-7 below provide some example computing devices/systems/environments and associated hardware that may be used in the context of embodiments as described herein.

Referring to FIG. 6, an embodiment of a block diagram for a computing system including a multicore processor is depicted. Processor 600 includes any processor or processing device, such as a microprocessor, an embedded processor, a digital signal processor (DSP), a network processor, a handheld processor, an application processor, a co-processor, a system on a chip (SOC), or other device to execute code. Processor 600, in one embodiment, includes at least two cores—core 601 and 602, which may include asymmetric cores or symmetric cores (the illustrated embodiment). However, processor 600 may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core often refers to logic located on an integrated circuit capable of maintaining an independent architectural state, wherein each independently maintained architectural state is associated with at least some dedicated execution resources. In contrast to cores, a hardware thread typically refers to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 600, as illustrated in FIG. 6, includes two cores—core 601 and 602. Here, core 601 and 602 are considered symmetric cores, i.e. cores with the same configurations, functional units, and/or logic. In another embodiment, core 601 includes an out-of-order processor core, while core 602 includes an in-order processor core. However, cores 601 and 602 may be individually selected from any type of core, such as a native core, a software managed core, a core adapted to execute a native Instruction Set Architecture (ISA), a core adapted to execute a translated Instruction Set Architecture (ISA), a co-designed core, or other known core. In a heterogeneous core environment (i.e. asymmetric cores), some form of translation, such a binary translation, may be utilized to schedule or execute code on one or both cores. Yet to further the discussion, the functional units illustrated in core 601 are described in further detail below, as the units in core 602 operate in a similar manner in the depicted embodiment.

As depicted, core 601 includes two hardware threads 601a and 601b, which may also be referred to as hardware thread slots 601a and 601b. Therefore, software entities, such as an operating system, in one embodiment potentially view processor 600 as four separate processors, i.e., four logical processors or processing elements capable of executing four software threads concurrently. As alluded to above, a first thread is associated with architecture state registers 601a, a second thread is associated with architecture state registers 601b, a third thread may be associated with architecture state registers 602a, and a fourth thread may be associated with architecture state registers 602b. Here, each of the architecture state registers (601a, 601b, 602a, and 602b) may be referred to as processing elements, thread slots, or thread units, as described above. As illustrated, architecture state registers 601a are replicated in architecture state registers 601b, so individual architecture states/contexts are capable of being stored for logical processor 601a and logical processor 601b. In core 601, other smaller resources, such as instruction pointers and renaming logic in allocator and renamer block 630 may also be replicated for threads 601a and 601b. Some resources, such as re-order buffers in reorder/retirement unit 635, ILTB 620, load/store buffers, and queues may be shared through partitioning. Other resources, such as general purpose internal registers, page-table base register(s), low-level data-cache and data-TLB 615, execution unit(s) 640, and portions of out-of-order unit 635 are potentially fully shared.

Processor 600 often includes other resources, which may be fully shared, shared through partitioning, or dedicated by/to processing elements. In FIG. 6, an embodiment of a purely exemplary processor with illustrative logical units/resources of a processor is illustrated. Note that a processor may include, or omit, any of these functional units, as well as include any other known functional units, logic, or firmware not depicted. As illustrated, core 601 includes a simplified, representative out-of-order (OOO) processor core. But an in-order processor may be utilized in different embodiments. The OOO core includes a branch target buffer 620 to predict branches to be executed/taken and an instruction-translation buffer (I-TLB) 620 to store address translation entries for instructions.

Core 601 further includes decode module 625 coupled to fetch unit 620 to decode fetched elements. Fetch logic, in one embodiment, includes individual sequencers associated with thread slots 601a, 601b, respectively. Usually core 601 is associated with a first ISA, which defines/specifies instructions executable on processor 600. Often machine code instructions that are part of the first ISA include a portion of the instruction (referred to as an opcode), which references/specifies an instruction or operation to be performed. Decode logic 625 includes circuitry that recognizes these instructions from their opcodes and passes the decoded instructions on in the pipeline for processing as defined by the first ISA. For example, as discussed in more detail below decoders 625, in one embodiment, include logic designed or adapted to recognize specific instructions, such as transactional instruction. As a result of the recognition by decoders 625, the architecture or core 601 takes specific, predefined actions to perform tasks associated with the appropriate instruction. It is important to note that any of the tasks, blocks, operations, and methods described herein may be performed in response to a single or multiple instructions; some of which may be new or old instructions. Note decoders 626, in one embodiment, recognize the same ISA (or a subset thereof). Alternatively, in a heterogeneous core environment, decoders 626 recognize a second ISA (either a subset of the first ISA or a distinct ISA).

In one example, allocator and renamer block 630 includes an allocator to reserve resources, such as register files to store instruction processing results. However, threads 601a and 601b are potentially capable of out-of-order execution, where allocator and renamer block 630 also reserves other resources, such as reorder buffers to track instruction results. Unit 630 may also include a register renamer to rename program/instruction reference registers to other registers internal to processor 600. Reorder/retirement unit 635 includes components, such as the reorder buffers mentioned above, load buffers, and store buffers, to support out-of-order execution and later in-order retirement of instructions executed out-of-order.

Scheduler and execution unit(s) block 640, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation buffer (D-TLB) 650 are coupled to execution unit(s) 640. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages.

Here, cores 601 and 602 share access to higher-level or further-out cache, such as a second level cache associated with on-chip interface 610. Note that higher-level or further-out refers to cache levels increasing or getting further way from the execution unit(s). In one embodiment, higher-level cache is a last-level data cache—last cache in the memory hierarchy on processor 600—such as a second or third level data cache. However, higher level cache is not so limited, as it may be associated with or include an instruction cache. A trace cache—a type of instruction cache—instead may be coupled after decoder 625 to store recently decoded traces. Here, an instruction potentially refers to a macro-instruction (i.e. a general instruction recognized by the decoders), which may decode into a number of micro-instructions (micro-operations).

In the depicted configuration, processor 600 also includes on-chip interface module 610. Historically, a memory controller, which is described in more detail below, has been included in a computing system external to processor 600. In this scenario, on-chip interface 610 is to communicate with devices external to processor 600, such as system memory 675, a chipset (often including a memory controller hub to connect to memory 675 and an I/O controller hub to connect peripheral devices), a memory controller hub, a northbridge, or other integrated circuit. And in this scenario, bus 605 may include any known interconnect, such as multi-drop bus, a point-to-point interconnect, a serial interconnect, a parallel bus, a coherent (e.g. cache coherent) bus, a layered protocol architecture, a differential bus, and a GTL bus.

Memory 675 may be dedicated to processor 600 or shared with other devices in a system. Common examples of types of memory 675 include DRAM, SRAM, non-volatile memory (NV memory), and other known storage devices. Note that device 680 may include a graphic accelerator, processor or card coupled to a memory controller hub, data storage coupled to an I/O controller hub, a wireless transceiver, a flash device, an audio controller, a network controller, or other known device.

Recently however, as more logic and devices are being integrated on a single die, such as SOC, each of these devices may be incorporated on processor 600. For example in one embodiment, a memory controller hub is on the same package and/or die with processor 600. Here, a portion of the core (an on-core portion) 610 includes one or more controller(s) for interfacing with other devices such as memory 675 or a graphics device 680. The configuration including an interconnect and controllers for interfacing with such devices is often referred to as an on-core (or un-core configuration). As an example, on-chip interface 610 includes a ring interconnect for on-chip communication and a high-speed serial point-to-point link 605 for off-chip communication. Yet, in the SOC environment, even more devices, such as the network interface, co-processors, memory 675, graphics processor 680, and any other known computer devices/interface may be integrated on a single die or integrated circuit to provide small form factor with high functionality and low power consumption.

In one embodiment, processor 600 is capable of executing a compiler, optimization, and/or translator code 677 to compile, translate, and/or optimize application code 676 to support the apparatus and methods described herein or to interface therewith. A compiler often includes a program or set of programs to translate source text/code into target text/code. Usually, compilation of program/application code with a compiler is done in multiple phases and passes to transform hi-level programming language code into low-level machine or assembly language code. Yet, single pass compilers may still be utilized for simple compilation. A compiler may utilize any known compilation techniques and perform any known compiler operations, such as lexical analysis, preprocessing, parsing, semantic analysis, code generation, code transformation, and code optimization.

Larger compilers often include multiple phases, but most often these phases are included within two general phases: (1) a front-end, i.e. generally where syntactic processing, semantic processing, and some transformation/optimization may take place, and (2) a back-end, i.e. generally where analysis, transformations, optimizations, and code generation takes place. Some compilers refer to a middle, which illustrates the blurring of delineation between a front-end and back end of a compiler. As a result, reference to insertion, association, generation, or other operation of a compiler may take place in any of the aforementioned phases or passes, as well as any other known phases or passes of a compiler. As an illustrative example, a compiler potentially inserts operations, calls, functions, etc. in one or more phases of compilation, such as insertion of calls/operations in a front-end phase of compilation and then transformation of the calls/operations into lower-level code during a transformation phase. Note that during dynamic compilation, compiler code or dynamic optimization code may insert such operations/calls, as well as optimize the code for execution during runtime. As a specific illustrative example, binary code (already compiled code) may be dynamically optimized during runtime. Here, the program code may include the dynamic optimization code, the binary code, or a combination thereof.

Similar to a compiler, a translator, such as a binary translator, translates code either statically or dynamically to optimize and/or translate code. Therefore, reference to execution of code, application code, program code, or other software environment may refer to: (1) execution of a compiler program(s), optimization code optimizer, or translator either dynamically or statically, to compile program code, to maintain software structures, to perform other operations, to optimize code, or to translate code; (2) execution of main program code including operations/calls, such as application code that has been optimized/compiled; (3) execution of other program code, such as libraries, associated with the main program code to maintain software structures, to perform other software related operations, or to optimize code; or (4) a combination thereof.

Referring now to FIG. 7, shown is a block diagram of another system 700 in accordance with an embodiment of the present disclosure. As shown in FIG. 7, multiprocessor system 700 is a point-to-point interconnect system, and includes a first processor 770 and a second processor 780 coupled via a point-to-point interconnect 750. Each of processors 770 and 780 may be some version of a processor. In one embodiment, 752 and 754 are part of a serial, point-to-point coherent interconnect fabric, such as a high-performance architecture. As a result, certain embodiments may be implemented within the QPI architecture.

While shown with only two processors 770, 780, it is to be understood that the scope of the present disclosure is not so limited. In other embodiments, one or more additional processors may be present in a given processor.

Processors 770 and 780 are shown including integrated memory controller units 772 and 782, respectively. Processor 770 also includes as part of its bus controller units point-to-point (P-P) interfaces 776 and 778; similarly, second processor 780 includes P-P interfaces 786 and 788. Processors 770, 780 may exchange information via a point-to-point (P-P) interface 750 using P-P interface circuits 778, 788. As shown in FIG. 7, IMCs 772 and 782 couple the processors to respective memories, namely a memory 732 and a memory 734, which may be portions of main memory locally attached to the respective processors.

Processors 770, 780 each exchange information with a chipset 790 via individual P-P interfaces 752, 754 using point to point interface circuits 776, 794, 786, 798. Chipset 790 also exchanges information with a high-performance graphics circuit 738 via an interface circuit 792 along a high-performance graphics interconnect 739.

A shared cache (not shown) may be included in either processor or outside of both processors; yet connected with the processors via P-P interconnect, such that either or both processors' local cache information may be stored in the shared cache if a processor is placed into a low power mode.

Chipset 790 may be coupled to a first bus 716 via an interface 796. In one embodiment, first bus 716 may be a Peripheral Component Interconnect (PCI) bus, or a bus such as a PCI Express bus or another third generation I/O interconnect bus, although the scope of the present disclosure is not so limited.

As shown in FIG. 7, various I/O devices 714 are coupled to first bus 716, along with a bus bridge 718 which couples first bus 716 to a second bus 720. In one embodiment, second bus 720 includes a low pin count (LPC) bus. Various devices are coupled to second bus 720 including, for example, a keyboard and/or mouse 722, communication devices 727 and a storage unit 728 such as a disk drive or other mass storage device which often includes instructions/code and data 730, in one embodiment. Further, an audio I/O 724 is shown coupled to second bus 720. Note that other architectures are possible, where the included components and interconnect architectures vary. For example, instead of the point-to-point architecture of FIG. 7, a system may implement a multi-drop bus or other such architecture.

While the present disclosure has been described with respect to a limited number of embodiments, those skilled in the art will appreciate numerous modifications and variations therefrom. It is intended that the appended claims cover all such modifications and variations as fall within the true spirit and scope of this present disclosure.

Illustrative examples of the technologies described throughout this disclosure are provided below. Embodiments of these technologies may include any one or more, and any combination of, the examples described below. In some embodiments, at least one of the systems or components set forth in one or more of the preceding figures may be configured to perform one or more operations, techniques, processes, and/or methods as set forth in the following examples.

Example 1 is an apparatus comprising: a substrate; an oxide layer on the substrate; a silicon layer on the oxide layer, the silicon layer comprising a waveguide region and etched regions adjacent to the waveguide region, a height of the etched regions being less than a height of the waveguide region; a photodetector layer on the silicon layer and adjacent the waveguide region of the silicon layer, the photodetector layer comprising germanium; a first contact connected to the etched regions; a second contact connected to the photodetector layer; and a resistive element adjacent to the photodetector layer.

Example 2 includes the subject matter of Example 1, wherein the resistive element comprises doped polysilicon.

Example 3 includes the subject matter of Example 1, wherein the resistive element comprises a metal.

Example 4 includes the subject matter of Example 3, wherein the metal is one of titanium nitride (TiN) or tungsten.

Example 5 includes the subject matter of any one of Examples 1-4, wherein the resistive element is generally between the etched regions and the photodetector layer.

Example 6 includes the subject matter of any one of Examples 1-5, wherein the resistive element is at least partially co-planar with the photodetector layer.

Example 7 includes the subject matter of any one of Examples 1-6, wherein the resistive element surrounds at least a majority of an outer surface of photodetector layer.

Example 8 includes the subject matter of any one of Examples 1-7, wherein the photodetector layer is generally rectangular and the resistive element is adjacent to the photodetector layer on at least three sides.

Example 9 includes the subject matter of any one of Examples 1-8, wherein: the photodetector layer is approximately 20 micrometers in length, approximately 0.2-0.7 um thick, and approximately 2-5 um wide; and the resistive element is approximately 20 micrometers in length, approximately 2 micrometers in width, and approximately 2 micrometers away from the photodetector layer.

Example 10 includes the subject matter of any one of Examples 1-7, further comprising a dielectric layer on the silicon layer and the photodetector layer, wherein the photodetector layer, the first contact, the second contact, and the resistive element are within the dielectric layer.

Example 11 includes the subject matter of Example 10, wherein the dielectric layer is an oxide layer.

Example 12 includes the subject matter of any one of Examples 1-11, wherein the first and second contacts comprise aluminum.

Example 13 includes the subject matter of any one of Examples 1-12, wherein the first contact is connected to the etched regions via one or more metal pillars, and the second contact is connected to the photodetector layer via one or more metal pillars.

Example 14 includes the subject matter of Example 13, wherein the metal pillars comprise tungsten.

Example 15 includes the subject matter of any one of Examples 1-12, wherein the etched regions and the waveguide region of the silicon layer comprise dopants.

Example 16 is a photodetector device comprising: an optical waveguide to receive light; a photodetector comprising the apparatus of any one of Examples 1-15, wherein the waveguide region of the apparatus is positioned to receive the light from the optical waveguide; a direct current (DC) source coupled to the resistive element; and output terminals coupled to the first and second contacts of the photodetector.

Example 17 includes the subject matter of Example 16, wherein the DC source is to provide between 1-50 mW of power to the resistive element.

Example 18 includes a system comprising: a photonic integrated circuit (PIC) to receive optical signals and convert the optical signals to electrical signals, the photonic integrated circuit comprising a plurality of photodetector devices, each photodetector device comprising an apparatus of any one of Examples 1-15; a transimpedance amplifier (TIA) to receive output signals of the PIC, the TIA to convert the output signals of the PIC to voltage signals; and a digital signal processor (DSP) to receive output signals of the TIA and convert the output signals of the TIA to digital signals.

Example 19 includes the subject matter of Example 18, further comprising passive optical devices between the optical interface and the one or more photodetector devices.

Example 20 includes the subject matter of Example 19, wherein the passive optical devices comprise one or more of an optical demultiplexer and a polarization splitter.

Example 21 includes the subject matter of any one of Examples 18-20, further comprising: an optical interface to receive optical signals from a fiber optic cable and provide the optical signals to the PIC; and an electrical interface to receive digital signals output by the DSP and provide the digital signals to a device.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

The invention claimed is:

1. An apparatus comprising:
    a substrate;
    an oxide layer on the substrate;
    a silicon layer on the oxide layer, the silicon layer comprising a waveguide region and etched regions adjacent to the waveguide region, a height of the etched regions being less than a height of the waveguide region;
    a photodetector layer on the silicon layer and adjacent the waveguide region of the silicon layer, the photodetector layer comprising germanium;
    a first contact connected to the etched regions;
    a second contact connected to the photodetector layer; and
    a resistive element adjacent to the photodetector layer.

2. The apparatus of claim 1, wherein the resistive element comprises doped polysilicon.

3. The apparatus of claim 1, wherein the resistive element comprises a metal.

4. The apparatus of claim 3, wherein the metal is one of titanium nitride (TiN) or tungsten.

5. The apparatus of claim 1, wherein the resistive element is generally between the etched regions and the photodetector layer.

6. The apparatus of claim 1, wherein the resistive element is at least partially co-planar with the photodetector layer.

7. The apparatus of claim 1, wherein the resistive element surrounds at least a majority of an outer surface of photodetector layer.

8. The apparatus of claim 1, wherein the photodetector layer is generally rectangular and the resistive element is adjacent to the photodetector layer on at least three sides.

9. The apparatus of claim 8, wherein:
    the photodetector layer is approximately 20 micrometers in length, approximately 0.2-0.7 um thick, and approximately 2-5 um wide; and
    the resistive element is approximately 20 micrometers in length, approximately 2 micrometers in width, and approximately 2 micrometers away from the photodetector layer.

10. The apparatus of claim 1, further comprising a dielectric layer on the silicon layer and the photodetector layer, wherein the photodetector layer, the first contact, the second contact, and the resistive element are within the dielectric layer.

11. The apparatus of claim 10, wherein the dielectric layer is an oxide layer.

12. The apparatus of claim 1, wherein the first and second contacts comprise aluminum.

13. The apparatus of claim 1, wherein the first contact is connected to the etched regions via one or more metal pillars, and the second contact is connected to the photodetector layer via one or more metal pillars.

14. The apparatus of claim 13, wherein the metal pillars comprise tungsten.

15. The apparatus of claim 1, wherein the etched regions and the waveguide region of the silicon layer comprise dopants.

16. A photodetector device comprising:
an optical waveguide to receive light;
a photodetector comprising:
- a silicon layer comprising a waveguide region and etched regions adjacent to the waveguide region, a height of the etched regions being less than a height of the waveguide region, wherein the waveguide region is positioned to receive the light from the optical waveguide;
- a germanium layer on the silicon layer and adjacent the waveguide region of the silicon layer;
- a first contact connected to the etched regions;
- a second contact connected to the germanium layer; and
- a resistive element adjacent to the germanium layer;
a direct current (DC) source coupled to the resistive element; and
output terminals coupled to the first and second contacts of the photodetector.

17. The photodetector device of claim 16, wherein the DC source is to provide between 1-50 mW of power to the resistive element.

18. A system comprising:
a photonic integrated circuit (PIC) to receive optical signals and convert the optical signals to electrical signals, the photonic integrated circuit comprising a plurality of photodetector devices, each photodetector device comprising:
- a silicon layer comprising a waveguide region and etched regions adjacent to the waveguide region, a height of the etched regions being less than a height of the waveguide region;
- a germanium layer on the silicon layer and adjacent the waveguide region of the silicon layer; and
- a resistive element adjacent to the germanium layer;
a transimpedance amplifier (TIA) to receive output signals of the PIC, the TIA to convert the output signals of the PIC to voltage signals; and
a digital signal processor (DSP) to receive output signals of the TIA and convert the output signals of the TIA to digital signals.

19. The system of claim 18, further comprising an optical interface and passive optical devices between the optical interface and the photodetector devices, the passive optical devices comprising one or more of an optical demultiplexer and a polarization splitter.

20. The system of claim 18, further comprising:
an optical interface to receive optical signals from a fiber optic cable and provide the optical signals to the PIC; and
an electrical interface to receive digital signals output by the DSP and provide the digital signals to a device.

* * * * *